United States Patent
Wu et al.

(10) Patent No.: US 11,189,347 B2
(45) Date of Patent: Nov. 30, 2021

(54) RESOURCE MANAGEMENT FOR MEMORY DIE-SPECIFIC OPERATIONS

(71) Applicant: Micron Technology, inc., Boise, ID (US)

(72) Inventors: Jiangang Wu, Milpitas, CA (US); James P. Crowley, Longmont, CO (US); Yun Li, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/818,115

(22) Filed: Mar. 13, 2020

(65) Prior Publication Data

US 2021/0287750 A1    Sep. 16, 2021

(51) Int. Cl.
| | |
|---|---|
| *G11C 16/14* | (2006.01) |
| *G11C 16/26* | (2006.01) |
| *G06F 12/02* | (2006.01) |
| *G06F 9/50* | (2006.01) |

(52) U.S. Cl.
CPC .......... *G11C 16/14* (2013.01); *G06F 9/5016* (2013.01); *G06F 12/0246* (2013.01); *G11C 16/26* (2013.01); *G06F 2209/503* (2013.01); *G06F 2209/508* (2013.01)

(58) Field of Classification Search
CPC ....... G11C 16/14; G11C 16/26; G06F 9/5016; G06F 9/5011; G06F 3/0659; G06F 12/0246; G06F 13/30; G06F 2209/503; G06F 2209/508
See application file for complete search history.

(56) References Cited

U.S. PATENT DOCUMENTS

2020/0089537 A1* 3/2020 Bahirat ................. G06F 3/0659
2020/0409875 A1* 12/2020 Park ..................... G06F 13/1647

* cited by examiner

*Primary Examiner* — Alfredo Bermudez Lozada
*Assistant Examiner* — David Lam
(74) *Attorney, Agent, or Firm* — Holland & Hart LLP

(57) ABSTRACT

Methods, systems, and devices for memory die resource management are described. A resource manager can determine, from a set of global resources for multiple memory dies of a memory sub-system, a set of die-specific resources for a memory die of the multiple memory dies of the memory sub-system. In some case, the set of die-specific resources can be allocated for read commands for the memory die. The resource manager can assign a read command to a die-specific resource of the set of die-specific resources based on the die-specific resource being available and refrain from assigning the read command to the die-specific resource based on the die-specific resource being unavailable.

20 Claims, 5 Drawing Sheets

RESOURCE MANAGEMENT FOR MEMORY DIE-SPECIFIC OPERATIONS

TECHNICAL FIELD

The following relates generally to a memory sub-system and more specifically to memory die resource management.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
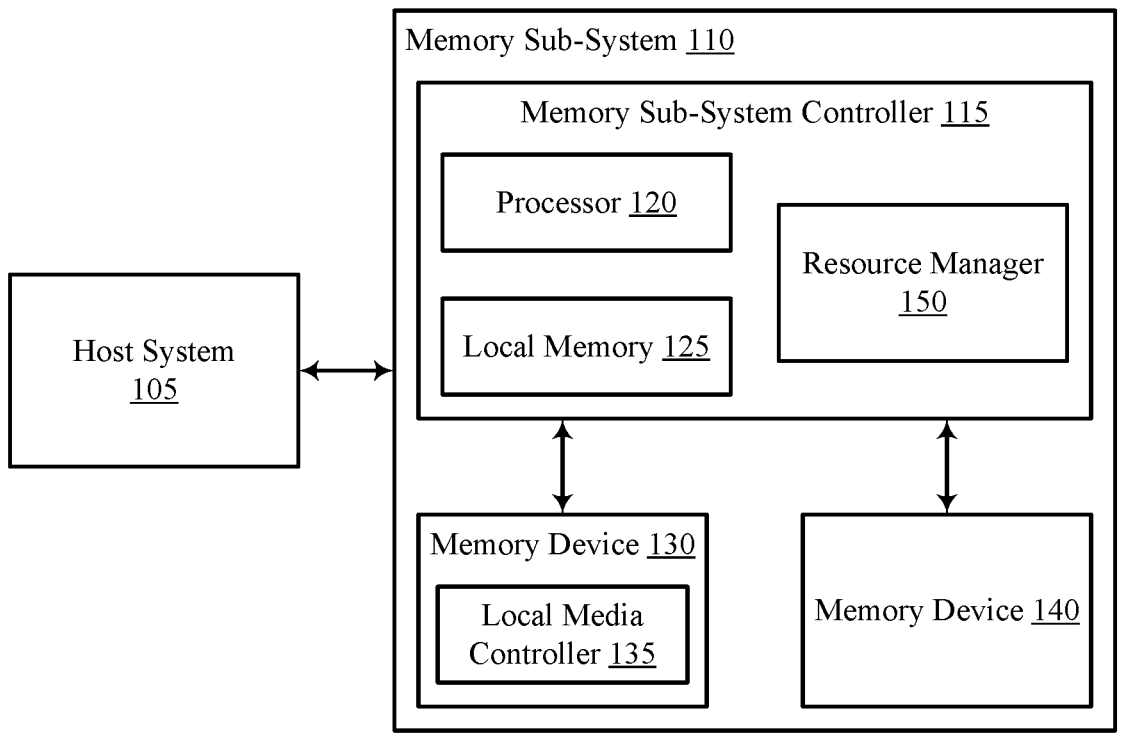
FIG. 1 illustrates an example of a computing system that includes a memory sub-system in accordance with some examples of the present disclosure.

Aspects of the present disclosure are directed to memory die resource management. A memory sub-system can be a storage device, a memory module, or a hybrid of a storage device and memory module. Examples of storage devices and memory modules are described herein in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A data block hereinafter refers to a unit of the memory device used to store data and can include a group of memory cells, a word line group, a word line, or individual memory cells.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system.

In some systems, a set of global resources for memory dies of a memory sub-system can be determined. The set of global resources can be an example of one or more entries of the memory die, a buffer of the memory die, or a reference queue of the memory die. In some examples, the one or more entries of the memory die can be assigned to a read operation. In such embodiments, the set of global resources can be non-specific to memory dies of the memory sub-system. For example, a set of global resources for one die of the memory sub-system can also be allocated for use by a different die of the memory sub-system, or can be unallocated (e.g., not utilized or assigned to any die). For example, a read command, a write command, or an erase command can be allocated to the set of global resources based on a request received from a host system in communication with the memory sub-system. In some systems, determining a set of global resources for multiple (e.g., a plurality of) memory dies without allocating commands to the set of global resources can decrease performance of the memory dies due to the increased latency caused by assigning the command to a global resource of the set of global resources.

Aspects of the present disclosure address the above and other deficiencies by having a memory sub-system that enables memory die resource management. For example, a set of resources of the set of global resources can be determined for or assigned to each memory die of the memory sub-system. In such embodiments, the set of resources (e.g., die-specific die have respective die-specific resources for operations associated with that memory die. In some examples, the assigned die-specific resource(s) can be allocated for read commands. In such embodiments, a resource manager of the memory sub-system or associated with the memory die can refrain from assigning a write command or an erase command to the assigned resource of the set of global resources.

In some embodiments, a resource manager can receive a request for an operation for a given memory die. The resource manager can check the command included in the request and determine whether to assign the command to the die-specific resource based on the command. The read commands can be assigned to the die-specific resource based on the type of command (e.g., a read command) and the resource being available. For example, a read request can be received for a read operation. The resource manager can check the reserved entries associated with the die-specific resource allocated for the read command. If an entry is free (e.g., a command is not assigned to an entry of the set of die-specific resources), the read command can be placed in the entry. If the entry is unavailable (e.g., a command is assigned to the entry of the set of die-specific resources), the read command can be placed in another entry that is associated with the set of global resources.

By determining a set of die-specific resources allocated for the read command, the overall performance of the memory sub-system can be increased. For example, enabling memory die resource management can improve the overall efficiency of the memory sub-system by decreasing the latency of the memory die when assigning the command (e.g., read command) to a die-specific of the set of global resources as resources are allocated for each memory die for specific operations (e.g., read operations). Such techniques can result in the memory sub-system experiencing improved read speeds, read operations, and improved processing times, and the like.

Features of the disclosure are initially described in the context of a computing environment as described with reference to FIG. 1. Features of the disclosure are described in the context of method, block diagrams, and example memory dies as described with reference to FIGS. 2 through 4. These and other features of the disclosure are further illustrated by and described with reference to a computer system that relates to memory die resource management as described with reference to FIG. 5.

FIG. 1 illustrates an example of a computing system 100 that includes memory sub-system 110 in accordance with some embodiments of the present disclosure. The memory sub-system 110 can include media, such as one or more non-volatile memory devices (e.g., memory device(s) 130), one or more volatile memory devices (e.g., memory device(s) 140), or a combination thereof.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digit (SD) card, and a hard disk drive (HDD). Examples of memory modules include a dual in-line memory module (DIMM), a small outline DIMM (SO-DIMM), and various types of non-volatile DIMM (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 105 that is coupled with one or more memory sub-systems 110. In some examples, the host system 105 is coupled with different types of memory sub-systems 110. FIG. 1 illustrates one example of a host system 105 coupled with one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 105 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 105 uses the memory sub-system 110, for example, to write data to the memory sub-system 110 and read data from the memory sub-system 110.

The host system 105 can be coupled to the memory sub-system 110 using a physical host interface. Examples of a physical host interface include, but are not limited to, a serial advanced technology attachment (SATA) interface, a peripheral component interconnect express (PCIe) interface, USB interface, Fiber Channel, Small Computer System Interface (SCSI), Serial Attached SCSI (SAS), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 105 and the memory sub-system 110. The host system 105 can further utilize a non-volatile memory Express (NVMe) interface to access components (e.g., memory device(s) 130) when the memory sub-system 110 is coupled with the host system 105 by the PCIe interface. The physical host interface can provide an interface for passing control, address, data, and other signals between the memory sub-system 110 and the host system 105. FIG. 1 illustrates a memory sub-system 110 as an example. In general, the host system 105 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device(s) 140) can be, but are not limited to, random access memory (RAM), such as dynamic RAM (DRAM) and synchronous DRAM (SDRAM).

Some examples of non-volatile memory devices (e.g., memory device(s) 130) includes a negative-and (NAND) type flash memory and write-in-place memory, such as three-dimensional cross-point ("3D cross-point") memory, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as NAND type flash memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric RAM (FeRAM), magneto RAM (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable ROM (EEPROM).

The memory sub-system controller 115 (or controller for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The memory sub-system controller 115 can be a microcontroller, special purpose logic circuitry (e.g., a field programmable gate array (FPGA), an application specific integrated circuit (ASIC), a digital signal processor (DSP)), or other suitable processor.

The memory sub-system controller 115 can include a processor 120 (e.g., a processing device) configured to execute instructions stored in a local memory 125. In the illustrated example, the local memory 125 of the memory sub-system controller 115 includes an embedded memory configured to store instructions for performing various processes, operations, logic flows, and routines that control operation of the memory sub-system 110, including handling communications between the memory sub-system 110 and the host system 105.

In some examples, the local memory 125 can include memory registers storing memory pointers, fetched data, etc. The local memory 125 can also include ROM for storing micro-code. While the example memory sub-system 110 in FIG. 1 has been illustrated as including the memory sub-system controller 115, in another example of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 105 and can convert the commands or operations into instructions or appropriate commands to achieve the desired access to the memory devices 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 105 via the physical host interface. The host interface circuitry can convert the commands received from the host system into command instructions to access the memory devices 130 and/or the memory device 140 as well as convert responses associated with the memory devices 130 and/or the memory device 140 into information for the host system 105.

The memory sub-system 110 can also include additional circuitry or components that are not illustrated. In some examples, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some examples, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a resource manager 150 that can determine or allocate a set of die-specific resources for a memory die (e.g., memory device 130, memory device 140, memory components of memory device 130, memory components of memory device 140). In such embodiments, the set of die-specific resources can be determined from a set of global resources for multiple (e.g., a plurality of) memory dies of the memory sub-system 110. In some embodiments, the set of die-specific resources can be allocated for read commands for the memory die. For example, if a write request or an erase request is received, the resource manager 150 can refrain from assigning a write command or an erase command based on the die-specific resource being allocated for read commands for the memory die.

The resource manager 150 can assign the read command to the die-specific resource based on the die-specific resource being available. In other examples, the resource manager 150 can refrain from assigning the read command to the die-specific resource based on the die-specific resource being unavailable. By determining the set of die-specific resources allocated for read commands, the resource manager 150 can reserve entries (e.g., die-specific resources) for the read commands, thereby improving performance and reliability. In addition, managing the memory dies on a die-by-die basis (e.g., determining the set of die-specific resources for each memory die of the multiple memory dies) can result in the memory sub-system experiencing improved read speeds and/or improved processing times.

In some examples, the memory sub-system controller 115 includes at least a portion of the resource manager 150. For example, the memory sub-system controller 115 can include a processor 120 (e.g., a processing device) configured to execute instructions stored in local memory 125 for performing the operations described herein. In some examples, the resource manager 150 is part of the host system 105, an application, or an operating system.

The resource manager 150 can determine an availably of a resource from the set of global resources if the die-specific resource is unavailable. In some embodiments, the resource manager 150 can assign the read command to the resource from the set of global resources based on the refraining from assigning the read command and determining the availability of the resource. Further details with regards to the operations of the resource manager 150 are described herein.

Figure 2:
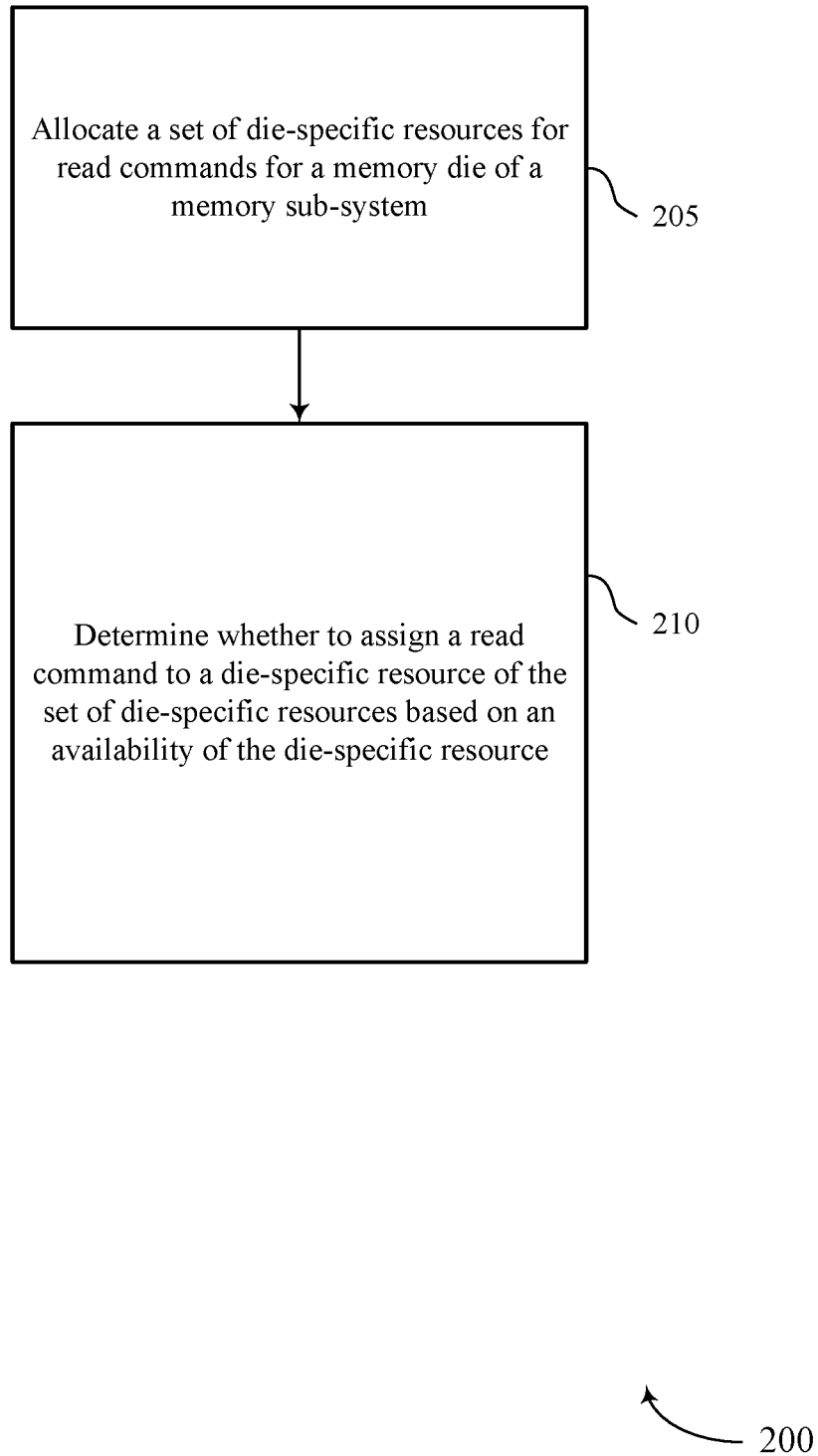
FIG. 2 is a diagram of an example method that supports memory die resource management in accordance with some examples of the present disclosure.

FIG. 2 is a diagram of an example method 200 that supports memory die resource management in accordance with some examples of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some examples, the method 200 is performed by the resource manager 150 of FIG. 1. Although shown in a particular sequence or order, unless otherwise specified, the order of the processes can be modified. Thus, the illustrated examples should be understood only as examples, and the illustrated processes can be performed in a different order, and some processes can be performed in parallel. Additionally, one or more processes can be omitted in various examples. Thus, not all processes are required in every example. Other process flows are possible.

At operation 205, the processing device can allocate a set of die-specific resources for read commands for a memory die of a memory sub-system. In some examples, aspects of the operations of 205 can be performed by resource manager 150 as described with reference to FIG. 1.

In some examples, the method 200 can include determining, from a set of global resources (e.g., global pool) for multiple (e.g., a plurality of) memory dies, a set of die-specific resources for a memory die of the multiple memory dies. In some embodiments, the set of global resources for the multiple memory dies of the memory sub-system are allocated to the multiple memory dies prior to receiving the read command. For example, the set of die-specific resources can be allocated for read commands for the memory die prior to receiving the read command.

In some examples, the processing device can assign the read command to a reference queue (e.g., priority queue) and transfer the read command to a transfer queue. The read command can be transferred to the transfer queue based on issuing the read command for the read operation. In some embodiments, the reference queue and transfer queue can each be representative of a clock cycle.

In some examples, the method 200 can include allocating the set of die-specific resources for read commands to the memory die based on a state of a central processing unit (CPU) for the memory sub-system (e.g., size of the CPU). In some embodiments, allocating the set of die-specific resources to the memory die is based on a command type (e.g., a read command).

In some examples, the method 200 can include determining that the read command is addressed to an address of the memory die. In such embodiments, the processing device can change an operating mode of the memory die based on determining that the read command is addressed to the memory die. For example, the processing device can change the operating mode of the memory device from a programming mode to a read operating mode. In some embodiments, the operating mode can be changed prior to determining whether to assign the read command to the die-specific resource.

At operation 210, the processing device can determine whether to assign a read command to a die-specific resource of the set of die-specific resources based on an availability of the die-specific resource. In some examples, aspects of the operations of 210 can be performed by resource manager 150 as described with reference to FIG. 1.

In some examples, the method 200 can include assigning a read command to a die-specific resource based on the die-specific resource being available. In such embodiments, the die-specific resource can be available if a read command is not assigned to the die-specific resource. In other examples, the method 200 can include refraining from assigning the read command to the die-specific resource on the die-specific resource being unavailable. In such embodiments, the die-specific resource can be unavailable if a read command is already assigned to the die-specific resource.

In some examples, the method 200 can include determining an availability of a resource (e.g., different from the die-specific resource) from the set of global resources based on the die-specific resource being unavailable. In such embodiments, the processing device can assign the read command to the resource from the set of global resources based on refraining from assigning the read command to the die-specific resource. In some embodiments, the processing device can also assign the read command to the resource from the set of global resources based on determining the availability of the resource from the set of global resources. The resource can be an example of an unallocated resource (e.g., a non-die-specific resource) from the set of global resources In some examples, the method 200 can include receiving a write request for a write operation for the memory die and refraining from assigning a write command to the die-specific resource based on the die-specific resource of the set of die-specific resources being allocated for read commands for the memory die. In some embodiments, the processing device can receive an erase request for an erase operation for the memory die and refrain from assigning an erase command to the die-specific resource based on the die-specific resource of the set of die-specific resources being allocated for read commands for the memory die. In such embodiments, the processing device can refrain from assigning a request other than a read request based on the die-specific resource being allocated for read commands. In other examples, the processing device can receive a read request for a read operation for the memory die and issue the read command after assigning the read command to the die-specific resource on the read request.

Figure 3:
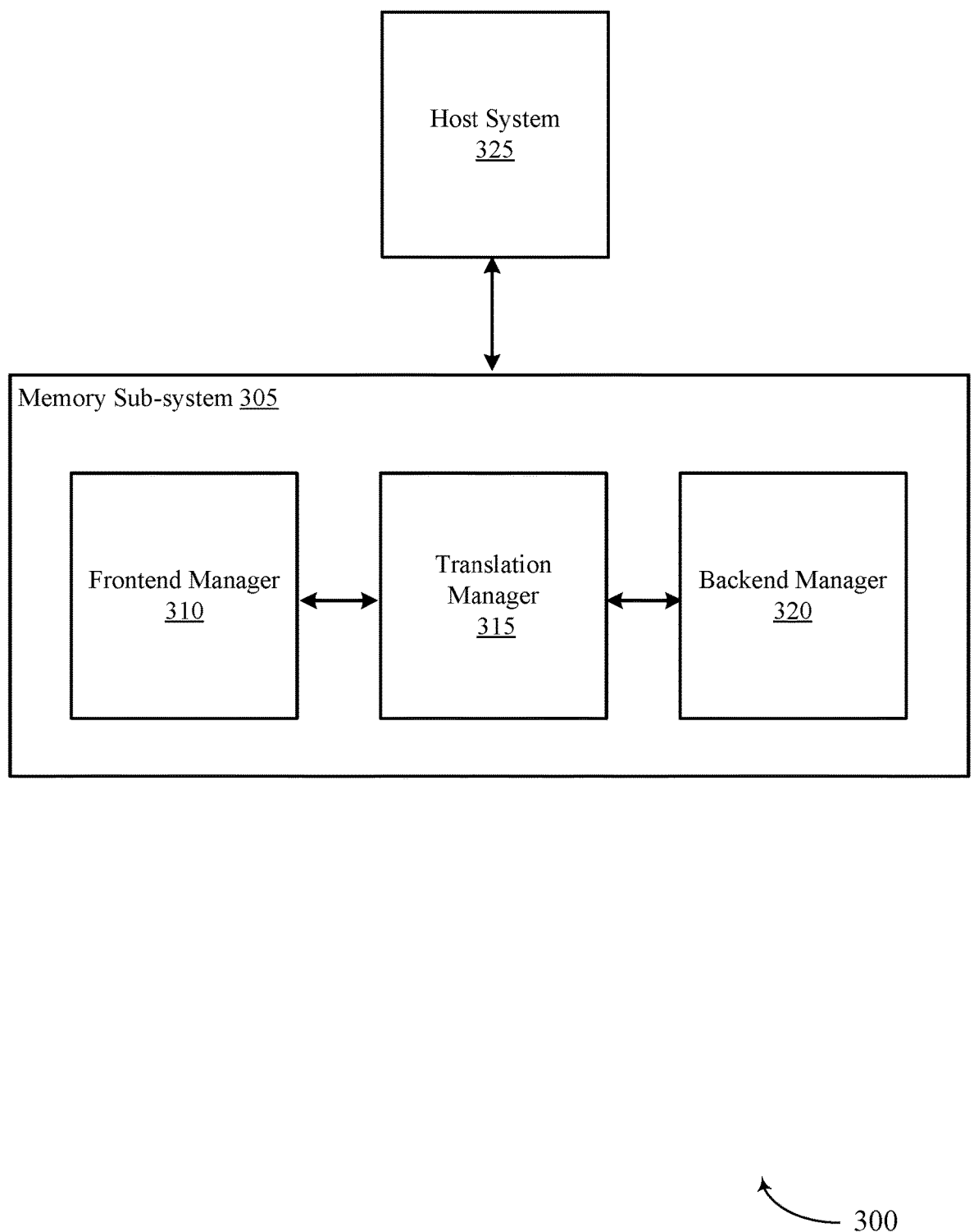
FIG. 3 is a block diagram of an example system that supports memory die resource management in accordance with some examples of the present disclosure.

FIG. 3 is a block diagram of an example system that supports memory die resource management in accordance with some examples of the present disclosure. The block diagram 300 can include memory sub-system 305 and host system 325. Memory sub-system 305 can include frontend manager 310, translation manager 315, and backend manager 320. The translation manager 315 can be an example of a Flash Translation Layer (FTL) manager.

The host system 325 can send (e.g., issue) host read requests, host write requests, and host erase requests, or other commands, to the memory sub-system 305. In some embodiments, the frontend manager 310 can receive the host read, write, or erase requests and process the requests from the host system 325. The frontend manager 310 can transfer the host read, write, or erase requests from the host system 325 to the translation manager 315.

In some examples, the frontend manager 310 can send (e.g., issue) internal read requests, internal write requests, and internal erase requests to the translation manager 315. In such embodiments, the frontend manager 310 can be part of a garbage collection procedure. For example, the frontend manager 310 can erase multiple pages during a single procedure, enable valid data of a block of data to be erased that is initially read into and stored by a buffer based on one or more read commands issued by a memory device controller and the corresponding page, and issue write commands once the corresponding read command has been completed.

The translation manager 315 can determine or allocate a set of die-specific resources for a memory die of multiple (e.g., a plurality of) memory dies of the memory sub-system 305. In such embodiments, the set of die-specific resources can be determined or allocated from a set of global resources for the multiple memory dies. The set of die specific resources can be allocated based on a command type (e.g., read commands). For example, the translation manager 315 can reserve a set of die-specific resources for bit commands such as read commands for a given memory die. The translation manager 315 can identify a number of dies and can allocate a number of bit commands equal to the number of dies. In such embodiments, every die (e.g., the number of dies) can include at least a corresponding bit command to be serviced when the bit command is sent to the backend manager 320.

In some examples, the set of die-specific resources can be allocated for read commands based on a state of a central processing unit (CPU) for the memory sub-system 305. In some embodiments, the size (e.g., amount) of the set of global resources (e.g., global pool) for multiple memory dies can be based on space of the CPU. For example, the size of the global pool can be reduced if the size of the global pool exceeds an amount of space of the CPU. In other examples, the size of the global pool can be increased if the amount of space of the CPU exceeds the size of the global pool. In some case, the size of the global pool can be adjusted based on software resources.

In some embodiments, the translation manager 315 can receive a read request for a read operation for the memory die. The read request can be a host read request from the host system 325 or an internal read request from the frontend manager 310. In such embodiments, the translation manager 315 can issue the read command for the read operation after assigning the read command to the die-specific resource.

The translation manager 315 can assign the read command to the die-specific resource if the die-specific resource is available (e.g., contains no command). The translation manager 315 can also refrain from assigning the read command to the die-specific resource if the die-specific resource is unavailable (e.g., contains a command). In some examples, the translation manager 315 can determine an availability of a different resource (e.g., a non-die-specific) from the set of global resources if the die-specific resource is unavailable. In such embodiments, the translation manager 315 can assign the read command to the resource from the set of global resources based on refraining from assigning the read command and determining that the resource is available.

For example, the set of global resources can dedicate resources within the set of resources for read commands for each memory die. When the global resources are initialized, the translation manager 315 can allocate a number of entries for the read command. When the translation manager 315 receives a read request, the number of entries for the read command can be checked to see if any entries are available (e.g., free of a read command). If the die-specific resource is unavailable, the translation manager 315 can check the remaining entries (e.g., entries not assigned to the read command) to assign the read command to the resource.

In other examples, the translation manager 315 can receive a write request for a write operation for the memory die. The write request can be a host write request from the host system 325 or an internal write request from the frontend manager 310. In such embodiments, the translation manager 315 can refrain from assigning the write command for the write operation to the die-specific resource based on the die-specific resource being allocated for read commands.

In some examples, the translation manager 315 can receive an erase request for an erase operation for the memory die. The erase request can be a host erase request from the host system 325 or an internal erase request from the frontend manager 310. In such embodiments, the translation manager 315 can refrain from assigning the erase command for the erase operation to the die-specific resource based on the die-specific resource being allocated for read commands.

The translation manager 315 can determine that the read command is addressed to an address of the memory die. In such embodiments, the translation manager 315 can change an operating mode of the memory die based on determining that the read command is addressed to the memory die. In some embodiments, the operating mode can be changed prior to determining whether to assign the read command to the die-specific resource. For example, the memory die can be operating in a programming mode when the translation manager 315 determines that a read command is addressed to the memory die (e.g., the memory die receives an incoming read request). In such embodiments, the translation manager 315 can change the operating mode from the programming mode to a read operating mode before servicing the read command. The translation manager 315 can refrain from communicating with the backend manager 320 that an operating mode of the memory die can be changed, but rather the translation manager 315 can communicate with the backend manager 320 the operating mode after the determination that the read command is addressed to the memory die.

In some embodiments, the translation manager 315 can issue the read command to the backend manager 320 to perform the read operation. For example, the backend manager 320 can receive the read command from the translation manager 315 and perform the read command. The backend manager 320 can read a value from the memory die and send the value to the translation manager 315, the frontend manager 310, the host system 325, or a combination thereof.

Figure 4:
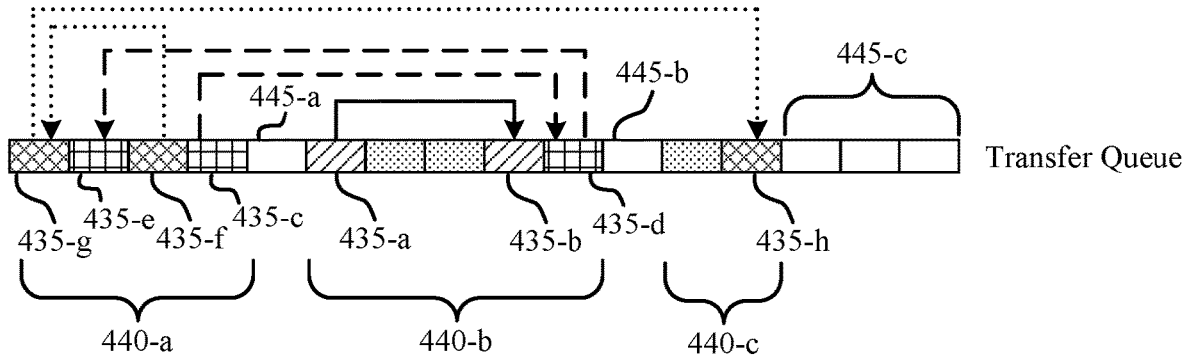
FIG. 4 is an example diagram that supports memory die resource management in accordance with some examples of the present disclosure.
Figure 4:
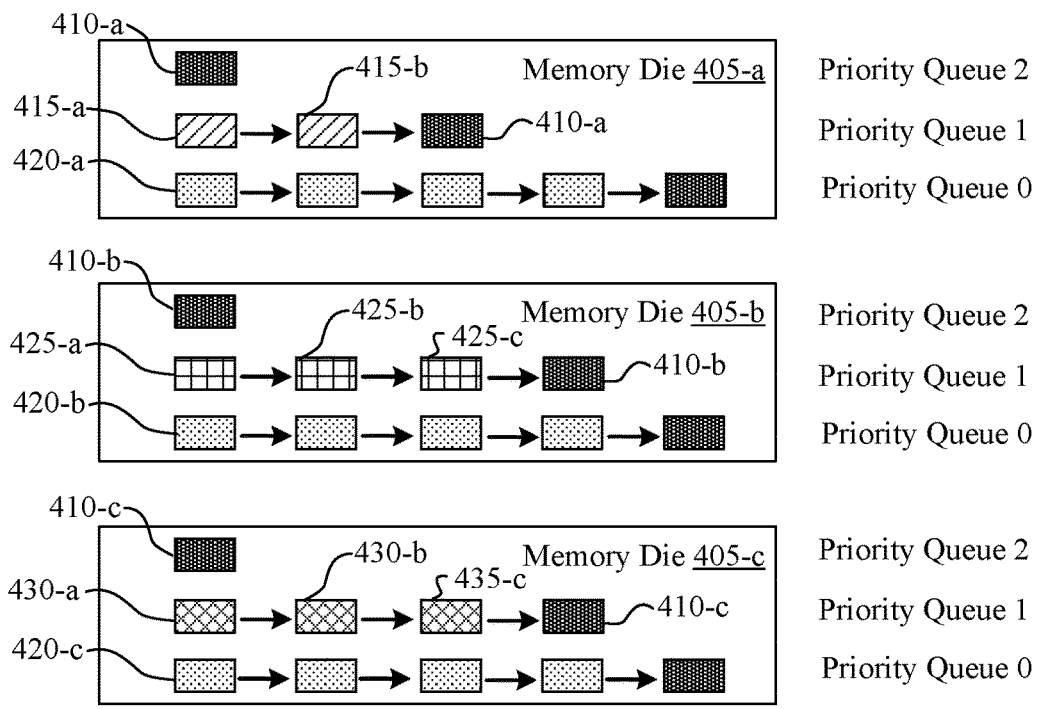

FIG. 4 is an example diagram that supports memory die resource management in accordance with some examples of the present disclosure. The diagram 400 can include memory dies 405-a, 405-b, and 405-c. Each memory die 405-a, 405-b, and 405-c can include priority queue 2, priority queue 1, and priority queue 0. Each priority queue can be an example of a reference queue. The diagram can also include a transfer queue which can include entries 435, allocated entries 440 and unallocated entries 445. In some embodiments, a queue can be an example of a clock cycle.

Memory die 405-a can include commands 410-a, 415, and 420-a. Priority queue 2 can include command 410-a. In some embodiments, command 410-a can be an example of a highest priority command (e.g., a host read command). A number of commands in the reference queue can be representative of a number of commands that can be issued and/or allocated to the set of die-specific resources. For example, the priority queue 2 can contain a single command, thereby indicating that a single command can be issued and/or allocated to the set of die-specific resources.

Priority queue 1 can include commands 415-a and 415-b. In some embodiments, commands 415-a and 415-b can each be an example of an internal read command. In such embodiments, priority queue 1 can be a dedicated queue for read commands other than host read commands. The dedicated read queue can be assigned for each individual die (e.g., memory die 405-a). In some examples, commands 415-a and 415-b can be issued after command 410-a in priority queue 2 based on a priority level of the queue. For example, the priority level of the queue can be based on a type of command. For example, a host read command (e.g., command 410-a) can be a higher priority to be issued than an internal read command (e.g., commands 415-a and 415-b). In some embodiments, priority queue 1 can contain three commands (e.g., commands 415-a and 415-b and command 410-a). The commands included in priority queue 1 can be allocated to the set of die-specific resources.

Priority queue 0 can include commands 420-*a*. In some embodiments, commands 420-*a* can be an example of other internal commands (e.g., write command or erase command). In such embodiments, commands 420-*a* can be issued after commands 415-*a* and 415-*b* in priority queue 1 based on a priority level of the queue. For example, an internal read command (e.g., commands 415-*a* and 415-*b*) can be a higher priority to be issued than other internal commands (e.g., commands 420-*a*). In some examples, the transfer queue cannot contain allocated entries for commands 420-*a* due to the allocated entries 435 being associated with a read command. In such embodiments, the commands 420-*a* can be transferred to an unallocated entry of unallocated entries 445 in the transfer queue. In some embodiments, priority queue 0 can contain five commands. In some embodiments, commands 420-*a* can be unallocated to the set of die-specific resources based on the set of die-specific resources being allocated to read commands.

In some examples, the commands 415-*a* and 415-*b* can be placed in the reference queue (e.g., priority queue 1) based on an order received from the host system. The translation manager can issue commands 415-*a* and 415-*b*, and then the translation manager can transfer each of the commands 415-*a* and 415-*b* from the reference queue to an entry in the transfer queue. For example, the command 415-*a* can be placed in entry 435-*a*, and the command 415-*b* can be placed in entry 435-*b*. In such embodiments, the commands 415-*a* and 415-*b* can be placed in the transfer queue in an order based on priority of commands, order the commands are received from the host system (e.g., order placed in the reference queue), based on memory die 405-*a*, or a combination thereof.

In some embodiments, a die-specific resource can automatically be allocated when the translation manager sends a request to the backend manager to issue the command. In some examples, the command 415-*a* and 415-*b* can be removed from the transfer queue based on performing a valid read operation (e.g., when the backend manager reads a value to the frontend manager or the host system). In other examples, if the commands 415-*a* and 415-*b* are unassigned to a transfer queue, the read operation can be pending (e.g., incomplete).

Memory die 405-*b* can include commands 410-*b*, 425, and 420-*b*. Priority queue 2 can include command 410-*b*. In some embodiments, command 410-*b* can be an example of a highest priority command (e.g., a host read command). A number of commands in the reference queue can be representative of a number of commands that can be issued and/or allocated to the set of die-specific resources. For example, the priority queue 2 can contain a single command, thereby indicating that a single command can be issued and/or allocated to the set of die-specific resources.

Priority queue 1 can include commands 425-*a*, 425-*b*, and 425-*c*. In some embodiments, commands 425-*a*, 425-*b*, and 425-*c* can each be an example of an internal read command. In such embodiments, priority queue 1 can be a dedicated queue for read commands. The dedicated read queue can be assigned for each individual die (e.g., memory die 405-*b*). In some examples, commands 425-*a*, 425-*b*, and 425-*c* can be issued after command 410-*b* in priority queue 2 based on a priority level of the queue. For example, the priority level of the queue can be based on a type of command. For example, a host read command (e.g., command 410-*b*) can be a higher priority to be issued than an internal read command (e.g., commands 425-*a*, 425-*b*, and 425-*c*). In some embodiments, priority queue 1 can contain four commands (e.g., commands 425-*a*, 425-*b*, and 425-*c* and command 410-*b*). The commands included in priority queue 1 can be allocated to the set of die-specific resources.

Priority queue 0 can include commands 420-*b*. In some embodiments, commands 420-*b* can be an example of other internal commands (e.g., write command or erase command). In such embodiments, commands 420-*b* can be issued after commands 425-*a*, 425-*b*, and 425-*c* in priority queue 1 based on a priority level of the queue. For example, an internal read command (e.g., commands 425-*a*, 425-*b*, and 425-*c*) can be a higher priority to be issued than other internal commands (e.g., commands 420-*b*). In some examples, the transfer queue cannot contain allocated entries for commands 420-*b* due to the allocated entries 435 being associated with a read command. In such embodiments, the commands 420-*b* can be transferred to an unallocated entry of unallocated entries 445 in the transfer queue. In some embodiments, priority queue 0 can contain five commands. In some embodiments, commands 420-*b* can be unallocated to the set of die-specific resources based on the set of die-specific resources being allocated to read commands.

In some examples, the commands 425-*a*, 425-*b*, and 425-*c* can be placed in the reference queue (e.g., priority queue 1) based on an order received from the host system. The translation manager can issue commands 425-*a*, 425-*b*, and 425-*c*, and then the translation manager can transfer the commands 425-*a*, 425-*b*, and 425-*c* from the reference queue to an entry in the transfer queue. For example, the command 425-*a* can be placed in entry 435-*c*, the command 425-*b* can be placed in entry 435-*d*, and the command 425-*c* can be placed in entry 435-*e*. In such embodiments, the commands 425-*a*, 425-*b*, and 425-*c* can be placed in the transfer queue in an order based on priority of commands, order the commands are received from the host system (e.g., order placed in the reference queue), based on memory die 405-*b*, or a combination thereof.

Memory die 405-*c* can include commands 410-*c*, 430, and 420-*c*. Priority queue 2 can include command 410-*c*. In some embodiments, command 410-*c* can be an example of a highest priority command (e.g., a host read command). A number of commands in the reference queue can be representative of a number of commands that can be issued and/or allocated to the set of die-specific resources. For example, the priority queue 2 can contain a single command, thereby indicating that a single command can be issued and/or allocated to the set of die-specific resources.

Priority queue 1 can include commands 430-*a*, 430-*b*, and 430-*c*. In some embodiments, commands 430-*a*, 430-*b*, and 430-*c* can each be an example of an internal read command. In such embodiments, priority queue 1 can be a dedicated queue for read commands. The dedicated read queue can be assigned for each individual die (e.g., memory die 405-*c*). In some examples, commands 430-*a*, 430-*b*, and 430-*c* can be issued after command 410-*c* in priority queue 2 based on a priority level of the queue. For example, the priority level of the queue can be based on a type of command. For example, a host read command (e.g., command 410-*c*) can be a higher priority to be issued than an internal read command (e.g., commands 430-*a*, 430-*b*, and 430-*c*). In some embodiments, priority queue 1 can contain four commands (e.g., commands 430-*a*, 430-*b*, and 430-*c* and command 410-*c*). The commands included in priority queue 1 can be allocated to the set of die-specific resources.

Priority queue 0 can include commands 420-*c*. In some embodiments, commands 420-*c* can be an example of other internal commands (e.g., write command or erase command). In such embodiments, commands 420-*c* can be issued after commands 430-*a*, 430-*b*, and 430-*c* in priority queue 1 based on a priority level of the queue. For example, an internal read command (e.g., commands 430-a, 430-b, and 430-c) can be a higher priority to be issued than other internal commands (e.g., commands 420-c). In some examples, the transfer queue cannot contain allocated entries for commands 420-c due to the allocated entries 435 being associated with a read command. In such embodiments, the commands 420-c can be transferred to an unallocated entry of unallocated entries 445 in the transfer queue. In some embodiments, priority queue 0 can contain five commands. In some embodiments, commands 420-c can be unallocated to the set of die-specific resources based on the set of die-specific resources being allocated to read commands.

In some examples, the commands 430-a, 430-b, and 430-c can be placed in the reference queue (e.g., priority queue 1) based on an order received from the host system. The translation manager can issue commands 430-a, 430-b, and 430-c, and then the translation manager can transfer the commands 430-a, 430-b, and 430-c from the reference queue to an entry in the transfer queue. For example, the command 430-a can be placed in entry 435-f, the command 430-b can be placed in entry 435-g, and the command 430-c can be placed in entry 435-h. In such embodiments, the commands 430-a, 430-b, and 430-c can be placed in the transfer queue in an order based on priority of commands, order the commands are received from the host system (e.g., order placed in the reference queue), based on memory die 405-c, or a combination thereof.

In some embodiments, the entries 435-a through 435-h can be reserved for the read command. For example, the number of entries in the transfer queue reserved for read commands can be equal to a number of memory dies. In some embodiments, the translation manager can allocate entries for the die-specific resources. For example, the transfer queue can include allocated entries 440-a, 440-b, and 440-c and unallocated entries 445-a, 445-b, and 445-c. Allocated entries 440-a, 440-b, and 440-c can include entries for read commands (e.g., commands 415, 425, and 430) while unallocated entries 445-a, 445-b, and 445-c can include entries for write commands, erase commands, or no commands (e.g., commands 420).

Figure 5:
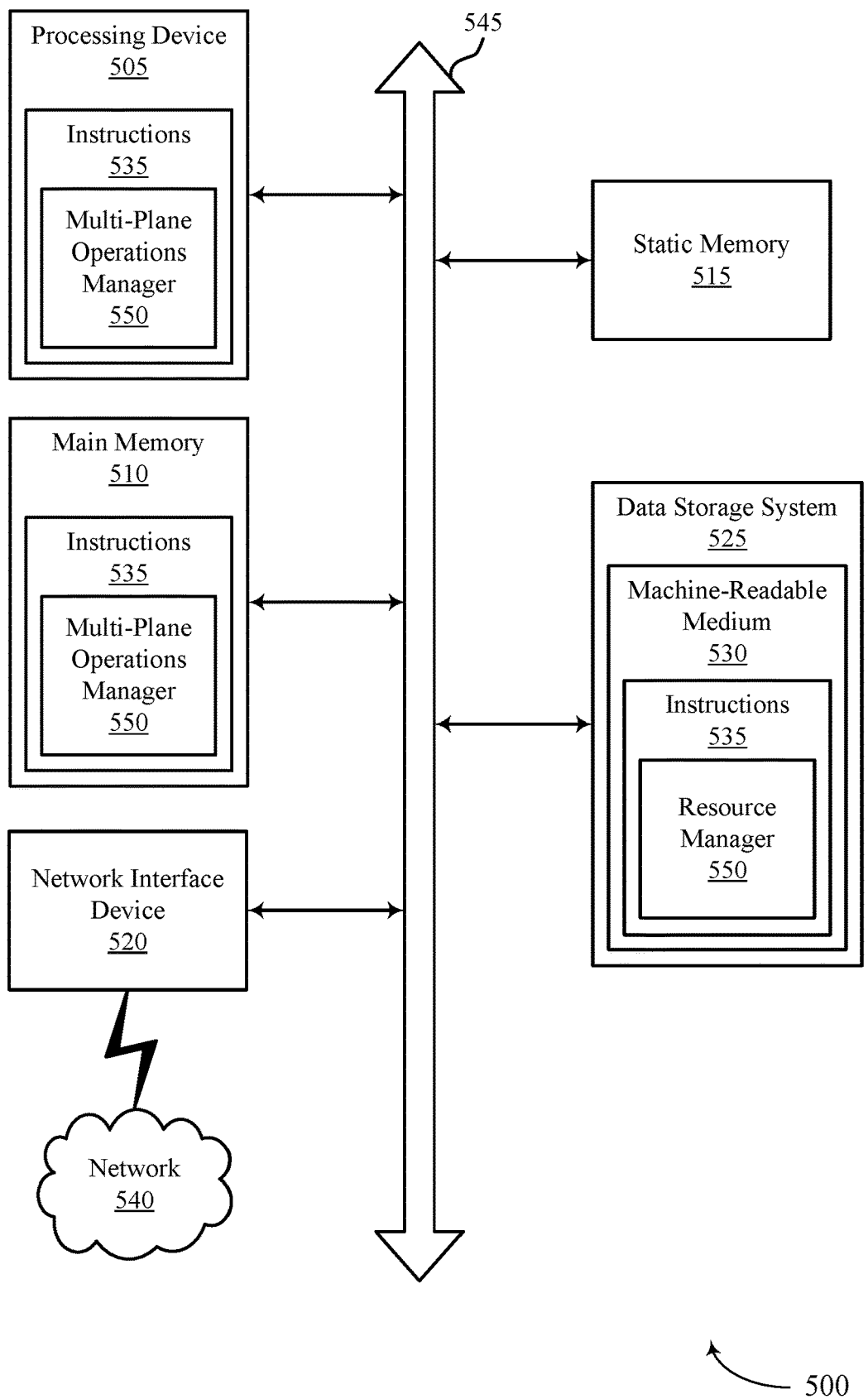
FIG. 5 is a block diagram of an example system that supports memory die resource management in accordance with some examples of the present disclosure.

FIG. 5 is a block diagram of an example system that supports memory die resource management in accordance with some examples of the present disclosure. The computer system 500 can include a set of instructions, for causing the machine to perform any one or more of the techniques described herein. In some examples, the computer system 500 can correspond to a host system (e.g., the host system 105 described with reference to FIG. 1) that includes, is coupled with, or utilizes a memory sub-system (e.g., the memory sub-system 110 described with reference to FIG. 1) or can be used to perform the operations of a controller (e.g., to execute an operating system to perform operations corresponding to the resource manager 150 described with reference to FIG. 1). In some examples, the machine can be connected (e.g., networked) with other machines in a local area network (LAN), an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" can also include any collection of machines that individually or jointly execute a set (or multiple sets) of instructions to perform any one or more of the methodologies discussed herein.

The example computer system 500 can include a processing device 505, a main memory 510 (e.g., ROM, flash memory, DRAM such as SDRAM or Rambus DRAM (RDRAM), etc.), a static memory 515 (e.g., flash memory, static RAM (SRAM), etc.), and a data storage system 525, which communicate with each other via a bus 545.

Processing device 505 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 505 can also be one or more special-purpose processing devices such as an ASIC, an FPGA, a DSP, network processor, or the like. The processing device 505 is configured to execute instructions 535 for performing the operations and steps discussed herein. The computer system 500 can further include a network interface device 520 to communicate over the network 540.

The data storage system 525 can include a machine-readable storage medium 530 (also known as a computer-readable medium) on which is stored one or more sets of instructions 635 or software embodying any one or more of the methodologies or functions described herein. The instructions 535 can also reside, completely or at least partially, within the main memory 510 and/or within the processing device 505 during execution thereof by the computer system 500, the main memory 510 and the processing device 505 also constituting machine-readable storage media. The machine-readable storage medium 630, data storage system 525, and/or main memory 510 can correspond to a memory sub-system.

In one example, the instructions 535 include instructions to implement functionality corresponding to a resource manager 550 (e.g., the resource manager 150 described with reference to FIG. 1). While the machine-readable storage medium 530 is shown as a single medium, the term "machine-readable storage medium" can include a single medium or multiple media that store the one or more sets of instructions. The term "machine-readable storage medium" can also include any medium that is capable of storing or encoding a set of instructions for execution by the machine and that cause the machine to perform any one or more of the methodologies of the present disclosure. The term "machine-readable storage medium" can include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, ROMs, RAMs, EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some examples, a machine-readable (e.g., computer-readable) medium includes a machine (e.g., a computer) readable storage medium such as ROM, RAM, magnetic disk storage media, optical storage media, flash memory components, etc.

In the foregoing specification, examples of the disclosure have been described with reference to specific example examples thereof. It will be evident that various modifications can be made thereto without departing from the broader spirit and scope of examples of the disclosure as set forth in the following claims. The specification and drawings are, accordingly, to be regarded in an illustrative sense rather than a restrictive sense.

What is claimed is:

1. A method comprising:
   determining, from a set of global resources for a plurality of memory dies of a memory sub-system, a set of die-specific resources for a memory die of the plurality of memory dies of the memory sub-system, the set of die-specific resources allocated for a plurality of read commands for the memory die;
   assigning a read command of the plurality of read commands to a die-specific resource of the set of die-specific resources based at least in part on the die-specific resource being available; and
   refraining from assigning the read command to the die-specific resource based at least in part on the die-specific resource being unavailable.

2. The method of claim 1, further comprising:
   determining an availability of a resource from the set of global resources based at least in part on the die-specific resource being unavailable; and
   assigning the read command to the resource from the set of global resources based at least in part on refraining from assigning the read command to the die-specific resource and determining the availability of the resource from the set of global resources.

3. The method of claim 1, further comprising:
   receiving a write request for a write operation for the memory die; and
   refraining from assigning a write command for the write operation to the die-specific resource based at least in part on the die-specific resource of the set of die-specific resources being allocated for read commands for the memory die.

4. The method of claim 1, further comprising:
   receiving a read request for a read operation for the memory die; and
   issuing the read command for the read operation after assigning the read command to the die-specific resource based at least in part on the read request.

5. The method of claim 1, further comprising:
   allocating the set of die-specific resources for read commands to the memory die based at least in part on a state of a central processing unit for the memory sub-system.

6. The method of claim 5, wherein allocating the set of die-specific resources to the memory die is based at least in part on a command type, the command type comprising the read command.

7. The method of claim 5, wherein the set of global resources for the plurality of memory dies of the memory sub-system are allocated to the plurality of memory dies prior to receiving the read command.

8. A method, comprising:
   determining, from a set of global resources for a plurality of memory dies of a memory sub-system, a set of die-specific resources for a memory die of the plurality of memory dies of the memory sub-system, the set of die-specific resources allocated for read commands for the memory die;
   assigning a read command to a die-specific resource of the set of die-specific resources based at least in part on the die-specific resource being available;
   refraining from assigning the read command to the die-specific resource based at least in part on the die-specific resource being unavailable;
   receiving an erase request for an erase operation for the memory die; and
   refraining from assigning an erase command for the erase operation to the die-specific resource based at least in part on the die-specific resource of the set of die-specific resources being allocated for read commands for the memory die.

9. A method, comprising:
   determining, from a set of global resources for a plurality of memory dies of a memory sub-system, a set of die-specific resources for a memory die of the plurality of memory dies of the memory sub-system, the set of die-specific resources allocated for read commands for the memory die;
assigning a read command to a die-specific resource of the set of die-specific resources based at least in part on the die-specific resource being available;
refraining from assigning the read command to the die-specific resource based at least in part on the die-specific resource being unavailable;
receiving a read request for a read operation for the memory die;
assigning the read command to a reference queue;
issuing the read command for the read operation after assigning the read command to the die-specific resource based at least in part on the read request; and
transferring the read command to a transfer queue based at least in part on issuing the read command for the read operation.

10. A method, comprising:
determining, from a set of global resources for a plurality of memory dies of a memory sub-system, a set of die-specific resources for a memory die of the plurality of memory dies of the memory sub-system, the set of die-specific resources allocated for read commands for the memory die;
determining that a read command is addressed to an address of the memory die;
changing an operating mode of the memory die based at least in part on determining that the read command is addressed to the memory die, wherein changing the operating mode of the memory die occurs prior to determining whether to assign the read command to a die-specific resource;
assigning the read command to the die-specific resource of the set of die-specific resources based at least in part on the die-specific resource being available; and
refraining from assigning the read command to the die-specific resource based at least in part on the die-specific resource being unavailable.

11. A system, comprising:
a plurality of memory components; and
a processing device, operatively coupled with the plurality of memory components, to:
allocate a set of die-specific resources for a plurality of read commands for a memory die of a memory sub-system, the set of die-specific resources determined from a set of global resources for a plurality of memory dies of the memory sub-system; and
determine whether to assign a read command of the plurality of read commands to a die-specific resource of the set of die-specific resources based at least in part on an availability of the die-specific resource.

12. The system of claim 11, further comprising:
the processing device to:
allocate a resource from the set of global resources based at least in part on the die-specific resource being unavailable; and
assign the read command to the resource from the set of global resources based at least in part on the die-specific resource being unavailable.

13. The system of claim 11, further comprising:
the processing device to:
receive a write request for a write operation for the memory die; and
refrain from assigning a write command for the write operation to any of the set of die-specific resources based at least in part on the set of die-specific resources being allocated for read commands.

14. The system of claim 11, further comprising:
the processing device to:
allocate the set of die-specific resources for read commands for the memory die based at least in part on a state of a central processing unit for the memory sub-system.

15. A system, comprising:
a plurality of memory components; and
a processing device, operatively coupled with the plurality of memory components, to:
allocate a set of die-specific resources for read commands for a memory die of a memory sub-system, the set of die-specific resources determined from a set of global resources for a plurality of memory dies of the memory sub-system;
determine whether to assign a read command to a die-specific resource of the set of die-specific resources based at least in part on an availability of the die-specific resource;
receive an erase request for an erase operation for the memory die; and
refrain from assigning an erase command for the erase operation to any of the set of die-specific resources based at least in part on the set of die-specific resources being allocated for read commands.

16. A non-transitory computer-readable storage medium comprising instructions that, when executed by a processing device, cause the processing device to:
determine, from a set of global resources for a plurality of memory dies of a memory sub-system, a set of die-specific resources for a memory die of the plurality of memory dies of the memory sub-system, the set of die-specific resources allocated for a plurality of read commands for the memory die;
assign a read command of the plurality of read commands to a die-specific resource of the set of die-specific resources based at least in part on the die-specific resource being available; and
refrain from assigning the read command to the die-specific resource based at least in part on the die-specific resource being unavailable.

17. The non-transitory computer-readable storage medium of claim 16, wherein the processing device is further to:
determine an availability of a resource from the set of global resources based at least in part on the die-specific resource being unavailable; and
assign the read command to the resource from the set of global resources based at least in part on refraining from assigning the read command to the die-specific resource and determining the availability of the resource from the set of global resources.

18. The non-transitory computer-readable storage medium of claim 16, wherein the processing device is further to:
receive a write request for a write operation for the memory die; and
refrain from assigning a write command for the write operation to the die-specific resource based at least in part on the die-specific resource of the set of die-specific resources being allocated for read commands for the memory die.

19. The non-transitory computer-readable storage medium of claim 16, wherein the processing device is further to:

allocate the set of die-specific resources for read commands to the memory die based at least in part on a state of a central processing unit for the memory sub-system.

20. A non-transitory computer-readable storage medium comprising instructions that, when executed by a processing device, cause the processing device to:

determine, from a set of global resources for a plurality of memory dies of a memory sub-system, a set of die-specific resources for a memory die of the plurality of memory dies of the memory sub-system, the set of die-specific resources allocated for read commands for the memory die;

assign a read command to a die-specific resource of the set of die-specific resources based at least in part on the die-specific resource being available;

refrain from assigning the read command to the die-specific resource based at least in part on the die-specific resource being unavailable;

receive an erase request for an erase operation for the memory die; and refrain from assigning an erase command for the erase operation to the die-specific resource based at least in part on the die-specific resource of the set of die-specific resources being allocated for read commands for the memory die.

* * * * *